United States Patent
Fukui (10) Patent No.: US 6,876,075 B2
(45) Date of Patent: Apr. 5, 2005

(54) ALUMINUM-SILICON CARBIDE SEMICONDUCTOR SUBSTRATE AND METHOD FOR PRODUCING THE SAME

(75) Inventor: Akira Fukui, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 549 days.

(21) Appl. No.: 09/959,508

(22) PCT Filed: Mar. 5, 2001

(86) PCT No.: PCT/JP01/01727

§ 371 (c)(1),
(2), (4) Date: Oct. 29, 2001

(87) PCT Pub. No.: WO01/69674

PCT Pub. Date: Sep. 20, 2001

(65) Prior Publication Data

US 2002/0195690 A1 Dec. 26, 2002

(30) Foreign Application Priority Data

Mar. 15, 2000 (JP) ................................ 2000-072257

(51) Int. Cl.⁷ ........................ H01L 21/302; H01L 21/461
(52) U.S. Cl. ........................ 257/712; 420/548; 428/472
(58) Field of Search ................ 257/712, 713; 428/472; 420/548

(56) References Cited

U.S. PATENT DOCUMENTS

| | | | |
|---|---|---|---|
| 4,746,637 A | | 5/1988 | Kasori et al. |
| 4,786,467 A | | 11/1988 | Skibo et al. |
| 4,796,077 A | * | 1/1989 | Takeda et al. ............ 257/705 |
| 5,000,246 A | | 3/1991 | Dwivedi et al. |
| 5,086,333 A | | 2/1992 | Osada et al. |
| 5,099,310 A | | 3/1992 | Osada et al. |
| 5,167,920 A | | 12/1992 | Skibo et al. |
| 5,386,329 A | * | 1/1995 | Ikegawa ................ 360/94 |
| 5,409,864 A | | 4/1995 | Osada et al. |
| 5,435,825 A | * | 7/1995 | Kusui et al. ............ 75/232 |
| 5,525,428 A | | 6/1996 | Osada et al. |
| 5,532,513 A | * | 7/1996 | Smith et al. ............ 257/703 |
| 5,563,101 A | | 10/1996 | Osada et al. |
| 5,708,959 A | | 1/1998 | Osada et al. |
| 5,525,428 A | | 3/1998 | Osada et al. |
| 5,917,269 A | | 6/1999 | Maruyama et al. |
| 6,183,874 B1 | | 2/2001 | Yamagata et al. |

FOREIGN PATENT DOCUMENTS

| | | |
|---|---|---|
| EP | 0 938 137 A2 | 8/1999 |
| EP | 1 030 369 A1 | 8/2000 |
| JP | 52-59572 A | 5/1977 |
| JP | 2-243729 A | 9/1990 |
| JP | 6-13494 A | 1/1994 |
| JP | 9-157773 A | 6/1997 |
| JP | 9-175867 A | 7/1997 |
| JP | 10-42579 A | 2/1998 |
| JP | 10-280082 A | 10/1998 |
| JP | 10-335538 A | 12/1998 |
| WO | WO 99/09595 | 2/1999 |

\* cited by examiner

Primary Examiner—David A. Zarneke
(74) Attorney, Agent, or Firm—Foley & Lardner LLP (57) ABSTRACT

An object of the present invention is to provide a lowcost semiconductor substrate made of an aluminum-silicon carbide (Al—SiC) composite material that has excellent thermal performance and that is capable of maintaining high dimensional accuracy and stability when practically used while coping with the flow of rapid diversification of a practical shape. Another object is to provide a package that can mount a semiconductor element that uses the substrate, and provide a semiconductor device that uses the substrate. In an aluminum-silicon carbide (Al—SiC) semiconductor substrate whose first component is a metal chiefly composed of aluminum (Al) and whose second component is silicon carbide (SiC), the second component is compositionally 5 to 60% by weight of the whole and the remainder is the first component, and a warp in the direction of its main surface is 3 $\mu$m/mm or less.

12 Claims, 4 Drawing Sheets

ALUMINUM-SILICON CARBIDE SEMICONDUCTOR SUBSTRATE AND METHOD FOR PRODUCING THE SAME

BACKGROUND OF THE INVENTION

1. Field of the Invention

The present invention relates to a substrate on which semiconductor elements can be mounted and that is made of an aluminum-silicon carbide composite material. It also relates to a method for manufacturing the substrate, a package for semiconductor elements that uses the substrate, and a semiconductor device that uses the substrate.

2. Description of the Prior Art

In recent years, as well as a mounting there has been an accelerated response of semiconductor elements degree of integration. This rapid growth has prompted focus on the effects of heat generated by the elements. As a result, a heat-dissipating substrate on which such semiconductor elements can be mounted and having excellent thermal conductivity has been required in order to efficiently dissipate the heat generated by the semiconductor elements to the outside.

Further, the heat-dissipating substrate has been required to reduce thermal strain caused at a combination interface between the semiconductor elements and peripheral members in a semiconductor package that contains the elements. Therefore, a thermal expansion coefficient of the heat-dissipating substrate that is equivalent to that of the semiconductor element and that of the peripheral member combined with the substrate is required. For example, the thermal expansion coefficients of silicon (Si) and gallium arsenide (GaAs) that are each a semiconductor element are 4.2 and 6.5, respectively, in a unit of [$10^{-6}/°$ C.]. Concerning a ceramic package, the thermal expansion coefficient of alumina ($Al_2O_3$) that is a general-purpose peripheral member thereof is 6.5 in a unit of [$10^{-6}/°$ C.]. Further, concerning a plastic package, for example, the thermal expansion coefficient of plastics is 12 through 17, which is relatively large, in a unit of [$10^{-6}/°$ C.]. A motherboard on which these are mounted is also plastic. Peripheral members, such as those mentioned above, have various levels of thermal expansion coefficients, and to correspond to these, the heat-dissipating substrate has employed a material whose thermal expansion coefficient is close to those of such peripheral members.

Further, recently, a minute chip size package of a wafer level size has appeared in response to a rapid rise in the wiring density of LSI for microprocessors. Accordingly, fine wires on a motherboard are being made with accelerating speed. A compact, light package component that can also be installed in, for example, a portable device is greatly desired as a component to be mounted on such a motherboard.

Tungsten (W), molybdenum (Mo), copper (Cu), and these composite materials (Cu—W or Cu—Mo) have been used conventionally as materials for the heat-dissipating substrate, as disclosed by, for example, Japanese Published Unexamined Patent Application No. S52-59572 or Published Unexamined Patent Application No. H6-13494. However, these materials are expensive and heavy in weight. Especially in a plastic package, since a motherboard on which the package is mounted is made of plastics small in rigidity, deformation will occur so as to cause difficulty in using the device if such a substrate is mounted on the motherboard. Similar to a ball grid array package (BGA package) described later, semiconductor equipment is recently connected to the motherboard by means of solder balls. Therefore, for example, if these materials are used for the heat-dissipating substrate, the solder balls will easily be damaged so as to be destroyed or deformed by the weight of the materials. A component for a package that is light in weight, that is excellent in matching a thermal expansion coefficient with peripheral members, and that is low cost is therefore in strong demand.

Concerning the package weight reduction, the same applies to the ceramic package. However, the plastic package that has undergone a considerable reduction in size is in much higher demand for its weight reduction than the ceramic package. Conventionally, in the plastic package that has less reliability than the ceramic package, the degree of integration of semiconductor elements is small, and, accordingly, the amount of dissipated heat is also small. Therefore, a quad flat package (QFP) shown on the left side of FIG. 1 has chiefly been used. However, recently, the degree of integration of semiconductor elements in the plastic package has also rapidly increased, and, as a result, the number of terminals that can correspond to it cannot be maintained. For this reason, a new packaging structure is being developed in succession.

Figure 1:
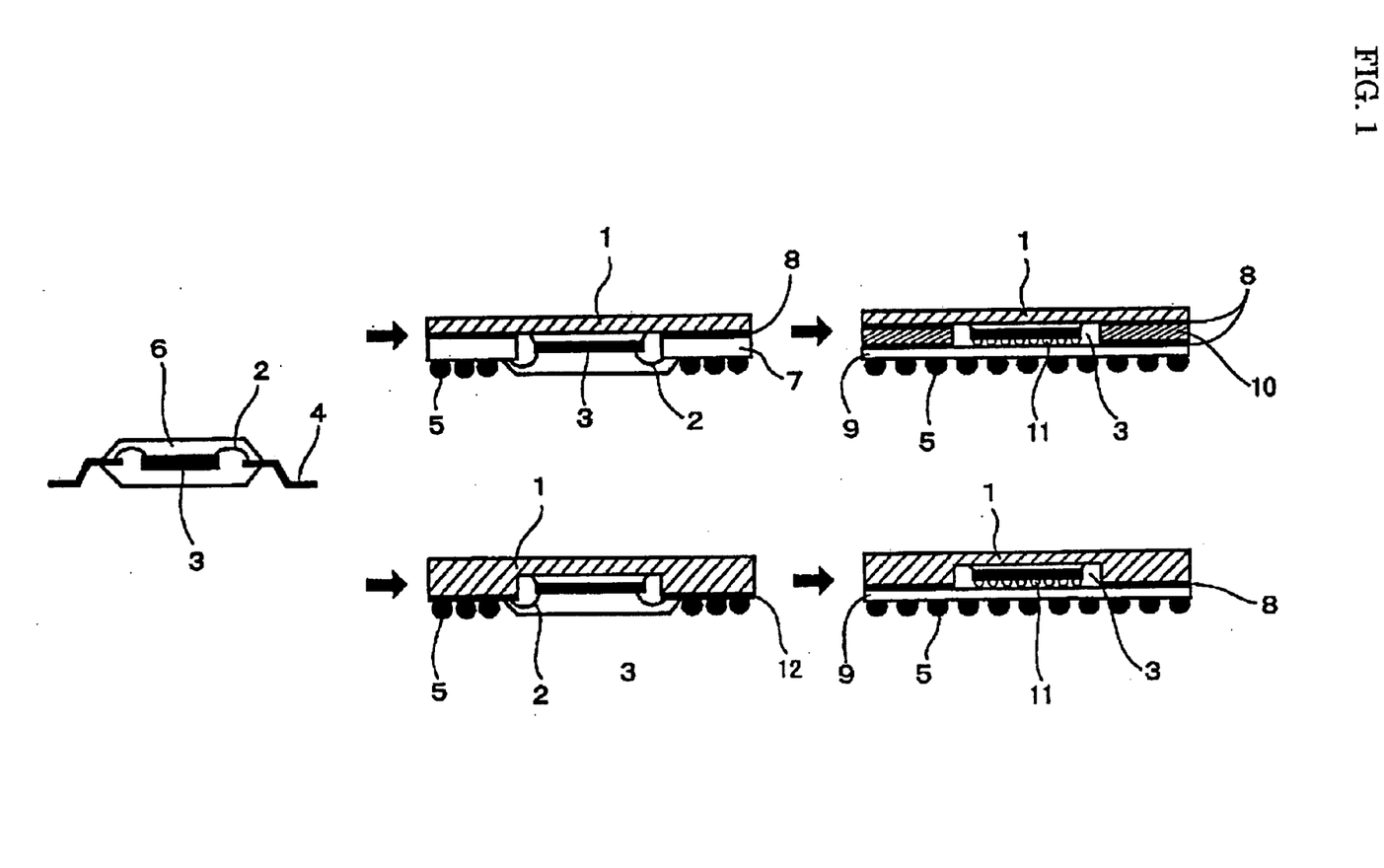
FIG. 1 explains a recent structural change of a plastic package.

Its circumstances will be typically shown by FIG. 1. The left object in the figure is of the aforementioned QFP type. A semiconductor element 3 is packaged with a wire lead 2 and a lead pin 4, and the whole thereof is enclosed and sealed by sealing resin 6. This is used in a case where an actual capacity is less than at most 1 W, and the number of terminals is within 250. If the actual capacity exceeds 3 W, and the number of terminals rises up to 1000, a package having a ball grid array (BGA) structure is used like those next to the left object in FIG. 1. This structure needs a heat-dissipating substrate 1, to which the semiconductor element 3 is joined by die bonding. Like that of the QFP type, the element 3 is packaged with a wire lead, but a solder ball 5 is used as a terminal instead of a pin, in order to increase the packaging density. In the upper middle object in FIG. 1, the heat-dissipating substrate 1 is a simple plate, in which a plastic substrate 7 is shaped like a frame for supporting it. In the lower middle object in FIG. 1, the heat-dissipating substrate 1 is shaped like a lid integrated with a frame part, to which the balls 5 are bonded with a tape 12. Recently, the number of terminals has exceeded 1000 as the actual capacity becomes larger, and thus the packaging structure has been changing to those shown at the rightmost side in FIG. 1. In this structure, the semiconductor element is packaged according to a method that uses a flip chip (FC) 11, and the number of ball grids on the undersurface of the plastic substrate also has greatly increased. In the upper rightmost object in FIG. 1, the heat-dissipating substrate 1 is a simple plate, and a frame-shaped metallic stiffener 10 serving to support the substrate 1 is disposed between the heat-dissipating substrate 1 and a plastic substrate 9 and is bonded to the two substrates with adhesive layers 8. In the lower rightmost object in FIG. 1, the heat-dissipating substrate 1 is of the lid type, and the balls 5 are bonded to the substrate 1 by means of a tape 8.

A weight reduction in the package and a change in its structure will advance rapidly in the future. In correlation therewith, a member to be packaged, such as a heat-dissipating substrate, is required to be light in weight and superior in thermal conductivity and be capable of easily coping with shape diversification or shape complexity. For example, its size is being made even more compact, and its shape is becoming very diversified in relation to the combination with peripheral members. For this reason, members that have high dimensional accuracy are required to be supplied at low cost and, in addition, the accuracy thereof must be maintained when practically used. In other words, members that are thinner in shape or are more complex in shape will be demanded in the future. In most cases, a substrate has been conventionally manufactured by connecting or uniting a plurality of flat plates together. However, in the future, it seems that most substrates will be constructed such that concavities/convexities with various patterns are formed on a part of the substrate and are integrated with each other, depending on the positional relationship with other components of a package. Further, it seems that the outer periphery of the main surface will be required to have a complex shape. These demands are strongly made especially onto small sized to medium-sized semiconductor devices used for general-purpose electronic equipment. However, demands are also gradually being made onto semiconductor devices larger than medium-sized devices, exduding plastic packages.

Figure 2:
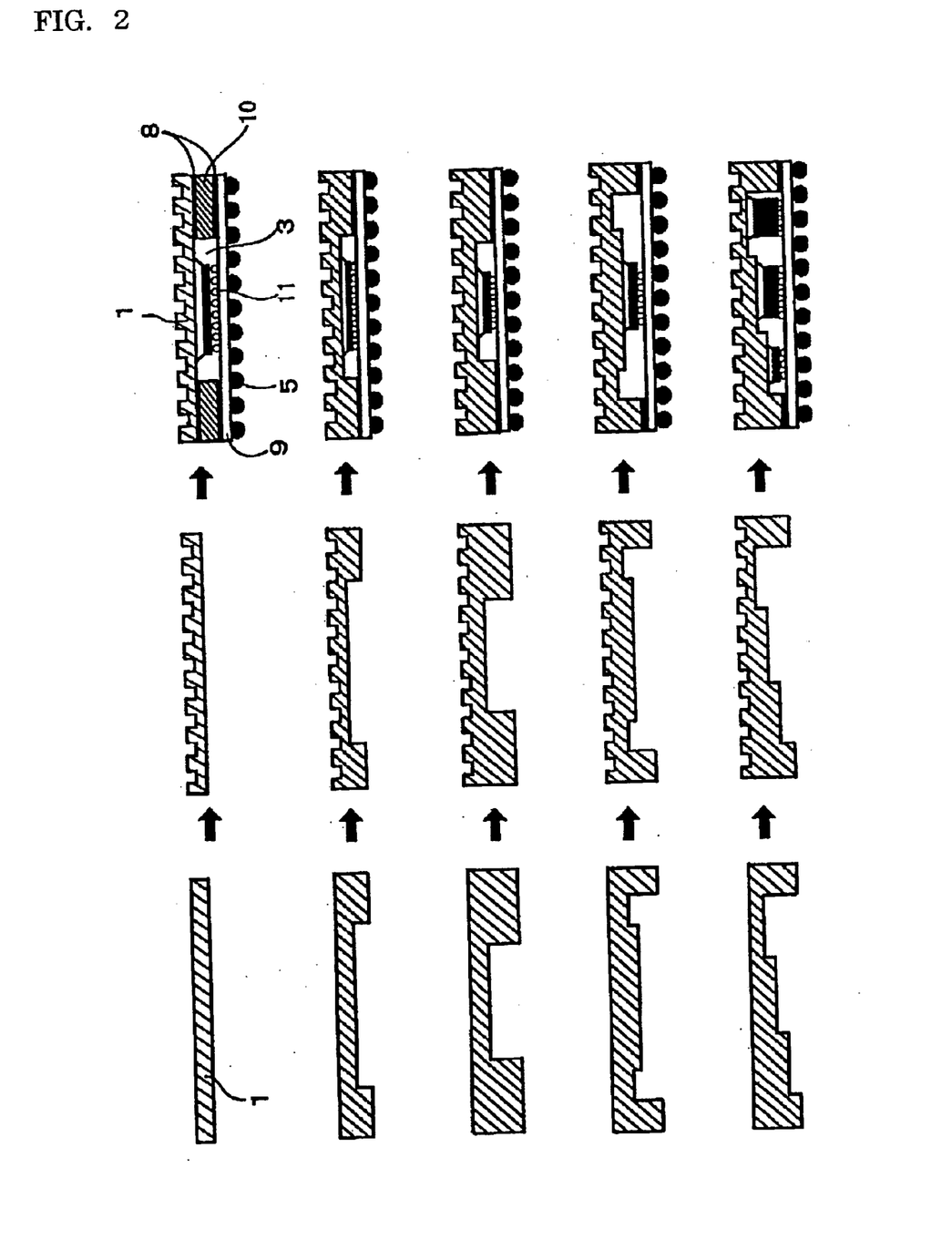
FIG. 2 explains various forms of a heat-dissipating substrate of a flip chip ball grid array type package.

FIG. 2 shows one example thereof Various forms of the heat-dissipating substrate are shown at the left of the figure. In FIG. 2, reference numerals are omitted except for the uppermost object. Each reference numeral designates the same component as that shown in FIG. 1. The uppermost substrate is a conventional one shaped like a simple plate. However in order to obtain a heat-dissipating area, for example, the substrate is required to have a shape in which a fin is formed in the heat-dissipating area, as shown in the middle object next to the simple-plate-shaped substrate. Concerning the left objects from the top to the bottom in FIG. 2, lid type substrates provided with variously shaped cavity parts are needed depending on the position or size of a semiconductor element to be mounted. If a fin is given to each of these substrates, they can be formed as shown at the middle of the figure. Packaging structures are shown at the right of the figure. In each of the packaging structures, the semiconductor element is subjected to the flip chip packaging by use of the substrate provided with the fin as shown at the middle of the figure, and the resulting package is mounted onto a motherboard by the ball grid array. In the uppermost structure, a frame stiffener must be interposed between the heat-dissipating substrate and the plastic substrate. Therefore, considerable time is consumed to package it, causing heat distortion to occur easily between the members because the connection parts increase. Accordingly, since the entire package is warped or deformed when packaged or operated, a reduction in reliability easily occurs. On the other hand, if a lid type of integrated substrate structure is employed as shown in the second to fifth objects on the right of the figure, such a problem will be easily solved. The conventional heat-dissipating substrate is at a disadvantage in that the substrate becomes expensive because of a rise in manufacturing costs if the substrate is complicated and integrated as mentioned above.

On the other hand, in order to meet the demand of weight reduction of the heat-dissipating substrate, the use of metal chiefly composed of, for example, ceramics or aluminum (Al) that is excellent in thermal conductivity has been considered. Concerning ceramics, aluminum nitride ceramics (AlN) and silicon nitride ceramic ($Si_3N_4$) are introduced by, for example, Published Unexamined Patent Application No. H9-175867. However, the thermal expansion coefficient of these materials is about 3 through 4 in a unit of $[10^{-6}/° C.]$, which is close to that of a silicon semiconductor element but is very low relative to that of plastics. Therefore, the application thereof especially to a plastic package is difficult. Ceramics have the drawback of a rise in material cost, in that deformation or damage occurs when manufactured, and in that machining is difficult. These bring about a rise in cost.

On the other hand, the drawback of metal chiefly composed of the latter, i.e., Al, is that the thermal expansion coefficient of pure Al is about 24 in a unit of $[10^{-6}/° C.]$, which is very high relative to not only that of a semiconductor element but also to that of plastics, and in that deformation or damage occurs easily because of its softness. Due to these circumstances, recently, to a composite (Al—SiC) of silicon carbide (SiC), which is excellent in thermal conductivity and light in weight, and Al has drawn interest. The Al—SiC is manufactured according to an infiltration method in which Al is infiltrated into a porous body of SiC as described in Published Unexamined Patent Application No. H2-243729; according to a sintering method in which Al powder and SiC powder are mixed at a desired composition ratio, and thereafter a resulting molded piece is sintered at a temperature above the melting point of Al as described in Published Unexamined Patent Application No. H10-335538 or Published Unexamined Patent Application No. H9-157773, according to a casting method in which molten Al is injected into a mold and is cast while mixing SiC powder therewith as described in Patent Application (kohyo) H1-501489. According to a dissolution method in which a plate is formed from molten Al, from which SiC particles have been dispersed, by cooling it continuously. The thermal expansion coefficient of Al is about 24, and that of SiC is about 4 in a unit of $[10^{-6}/° C.]$. In this material, a thermal expansion coefficient can be controlled within a wide range by changing the amount of both components, and making it light weight. Therefore, this is one of the suitable materials for a heat-dissipating substrate used for not only a plastic package but also various packages. For this reason, practical use as a component for a package is rapidly advancing.

On the other hand, in a semiconductor device, the degree of integration of a semiconductor element is rapidly increasing as mentioned above. Accordingly, a package in which the element is contained and its component is required to have high thermal conductivity that a conventional device does not have, and is required to cause its thermal expansion coefficient to be closer to that of a peripheral member has been demanded. In addition, its size is being made more compact, and its shape is being more diversified in relation to the combination with the peripheral member. It is important for these components to be inexpensively supplied.

When viewed from the above-mentioned viewpoint, the composite material Al—SiC has several drawbacks as follows. When manufactured according to the infiltration method, according to the sintering method, according to the casting method, or according to the dissolution method mentioned above, considerable time is consumed for the finish machining of a material after compositional processing is carried out, and, disadvantageously, tools wear out in a short time because SiC particles are hard. Therefore, if the component is simple in shape, this problem is relatively easy to solve, but if the shape of a package is further thinned, further complicated, and further diversified, this problem is exacerbated. Additionally, if the component is required to have higher dimensional accuracy in correlation with peripheral members, the provision of a material capable of simplifying its finish machining will be in strong demand. It is therefore an object of the present invention to inexpensively provide an Al—SiC semiconductor substrate that is superior in thermal performance and that is capable of stably maintaining high dimensional accuracy when practically used while coping with the current of rapid diversification of a practical shape. It is another object thereof to provide a package in which a semiconductor element using the substrate can be installed and provide a semiconductor device using the substrate.

SUMMARY OF THE INVENTION

A substrate provided by the present invention is an aluminum-silicon carbide (Al—SiC) semiconductor substrate in which a first component is metal chiefly composed of aluminum (Al) and a second component is silicon carbide (SiC), wherein the second component is 5 to 60% by weight of the whole, and the remainder is the first component, and a warp in the direction of the main surface thereof is 3 µm/mm or less.

A manufacturing method for a semiconductor substrate of the present invention includes a step of preparing a composite material whose first component is metal chiefly composed of aluminum (Al) and whose second component is silicon carbide(SiC), wherein the second component is compositionally 5 to 60% by weight of the whole and the remainder is the first component, and a step of applying corrosion-resistant treatment onto a part of the composite material, thereafter bringing the composite material into contact with a corrosive, thereby removing a part other than the part subjected to the corrosion-resistant treatment, and shaping a form.

The present invention includes a package that can contain a semiconductor element using the semiconductor substrate, and a semiconductor device using the substrate.

DESCRIPTION OF REFERENCE CHARACTERS

Heat substrate 1, wire lead 2, semiconductor element 3, pin terminal 4, ball grid terminal 5, sealing resin layer 6, frame 7, adhesive layer 8, plastic substrate 9, stiffener 10, flip chip 11, adhesive layer 12, substrate sample 13, surface plate 14, laser source 15, laser beam 16, and motherboard 17.

DETAILED DESCRIPTION OF THE PREFERRED EMBODIMENTS

A semiconductor substrate of the present invention will be described hereinafter in relation to a manufacturing method thereof An aluminum-silicon carbide (Al—SiC) composite material which is a material of the substrate of the present invention is manufactured according to the infiltration method, the sintering method, the casting method, the dissolution method, or a combination of these methods, as mentioned above. The infiltration method is a method for infiltrating the melted Al into the hole of a porous body made of SiC powder in a non-oxidizing atmosphere. Since there is a need to maintain the shape of the SiC porous body, the amount of SiC in the composite material obtained by this method is controlled to be within the range up to 60% by weight, in which the lower limit is 40% by weight. The sintering method is a method for mixing Al powder and SiC powder together at a desired composition ratio, and sintering a resulting molded piece at a temperature above the melting point of Al in a non-oxidizing atmosphere. The sintering process includes pressure means, such as forging, hot pressing, hot isostatic pressing (HIP), and hot extrusion. The amount of SiC in the composite material obtained by this method is controlled within the range of 5 to 60% by weight. The casting method is a method for casting molten Al and SiC powder into a mold, thereafter mixing them, and solidifying them. The dissolution method is a method for dispersing SiC particles into molten Al, thereafter sequentially and continuously cooling the dispersed ones, and compounding them. The amount of SiC in the composite material obtained by the casting method or the dissolution method is controlled within the range of 5 to 60% by weight. The reason why the lower limit of SiC is fixed at 5% by weight excluding the infiltration method is that there is almost no difference between the thermal expansion coefficient or the thermal conductivity of SiC and that of Al if the lower limit thereof is less than that value, and therefore the advantage of including SiC will be eliminated. On the other hand, the reason why the upper limit of SiC is fixed at 60% by weight in all of the above-mentioned methods is that the removal of the remaining SiC in corrosion treatment becomes difficult if the limit exceeds that value. In a material that includes SiC below 40% by weight, the powder obtained after the mixture can be shaped like a sheet by thinly and directly applying plastic processing thereonto by means of a hot roll or the like according to the sintering method, for example. Alternatively, a plate material contemporarily compounded by the sintering method, by the casting method, or by the dissolution method can be again heated and can undergo plastic processing. If a large processing degree in thickness and in width is given by the plastic processing when the material is shaped like, for example, a sheet, it will be also possible to add slight heat treatment and remove residual stress after the plastic processing is completed.

The thus prepared Al—SiC composite material has its parts removed by a corrosive and takes on a form. This procedure will be hereinafter described with reference to an example of a flat plate made of the composite material. As typically shown in FIG. 3, let us assume that a center part (i.e., part enclosed by the dotted line of the figure) of a square main surface of a flat plate is excavated by a predetermined depth and is removed. It is preferable to use a corrosive that reacts to Al relatively slowly or that dissolves Al. A substance that is a metal salt solution and exhibits acescence or a substance in which oxygen ions are free is usually used as a suitable substance for such a corrosive. For example, a weak solution of sulfate of copper more precious than Al, a weak solution of inorganic salt such as chloride, or a weak solution of organic salt such as copper acetate is used as that of a preferable metal salt. Preferably, the concentration of these materials in the solution is normally prepared to be 3 to 50% by weight. If it is less than the lower limit, too much time will be consumed for corrosion treatment. On the other hand, if it exceeds the upper limit, concavities/convexities will easily appear in a corroded removal part. A substance that exhibits alkalescence in water, such as sodium carbonate ($Na_2CO_3$), may be mixed in as needed to finely adjust the pH of the corrosive and control the corrosion speed.

Corrosion-resistant treatment that forms a coating layer of a desired pattern that can resist the corrosive prior to corrosion treatment is carried out to leave the part that has not been removed as it is. A material that is not eroded with the corrosive and is capable of easily adhering to a raw material is used as a material of the coating layer. For example, resin or rubber is usually used. If rubber is used, a thin sheet of rubber is prepared, and is bonded to a part provided with a desired pattern with an adhesive that can resist the corrosive. Alternatively, an organic solvent that has dissolved rubber is applied to the surface of the raw material and is dried. Thereafter, the corrosive is sprayed onto the coating surface, or the raw material is soaked in the corrosive so as to bring them into contact with each other, and the necessary parts are gradually removed. The temperature of the corrosive can be higher than room temperature, but room temperature is sufficient to maintain the corrosive. In the case in which an extremely shallow concave part is formed by corrosion, only its surface can be removed by electrolytic polishing in which, for example, a raw material that has undergone corrosion-resistant treatment serves as an anode. If a material that has minute SiC particles is prepared beforehand in this case, a removal surface with extremely fine surface roughness can be obtained. For example, a surface whose surface roughness Ra of JIS is below 2 µm or even below 1 µm easily can be obtained. Therefore, after the usual corrosion and removal is carried out, the process can be carried out to perform smooth finishing or to carve an extremely shallow concavo-convex part less than 5 µm. After the corrosion treatment is completed, the raw material is washed in water immediately, and residue is removed.

If the raw material that has undergone the corrosion treatment in this way has remaining SiC particles or reactants, the residue is removed therefrom. If slight surface finishing, which is usually employed, is needed, any removal method, such as barrel polishing or blast grinding, can be carried out.

A predetermined main surface of penetration part can be formed in the raw material. Accordingly, when a small component having a predetermined shape is cut and separated from, for example, a plate material, this method can be used. In this case, grooves or concavities used for separation can be formed beforehand in the raw material. When a plurality of concave parts with various depths and convex parts with various heights are formed, they can be formed continuously or intermittently while being divided several times. According to the conventional method, machining is very difficult, and tools completely wear out. In contrast, according to the method of the present invention, it is relatively easy to carry out shape processing as described above, and, processing costs can advantageously be greatly lowered.

The aluminum-silicon carbide (Al—SiC) semiconductor substrate of the present invention obtained by the above method leaves neither stress nor distortion because neither mechanical stress nor heat is given when level differences or concavities/convexities are provided although such mechanical stress or heat is given in the conventional grinding. Therefore, a warp in the direction of the main surface resulting after finish treatment is much smaller, i.e., below 3 µm/mm than conventional examples. Further, the substrate of the present invention can seldom cause a new warp or deformation resulting from residual stress because there is minimal residue after treatment even if mechanical stress or thermal stress is applied from the outside when it is contained in a package. Therefore, the substrate of the present invention has high-strength against damage caused by fatigue in thermo-cycles during operation after the substrate is built in a semiconductor device. According to the method of the present invention, it is therefore, possible to provide a substrate that has a shape integrated into a complex form as mentioned above and that has a small warp or deformation after it is mounted or when actually operated. For example, during machine treatment, if concavities/convexities are partially formed in the substrate or if its outer periphery is complicated on the condition that its thickness is below 2 mm, the treatment will become extremely difficult, and the occurrence of a large warp or deformation cannot be avoided. For example, an external dimension thereof exceeding 30 mm will cause a warp or deformation that exceeds 10 µm/mm. However, according to the method of the present invention, a substrate having almost no warp or deformation can be obtained even if concavities/convexities are formed in its main surface that are wide and thin. Further, it is possible to manufacture a multi-piece substrate shaped like a tape in which perforations are formed in a sheet-shaped substrate by corrosion treatment.

In the semiconductor substrate of the present invention, if the area of a part to be corroded and removed is below 50% of the entire main surface, such a warp level as mentioned above can be obtained even if it is substantially thin. For example, even if the ratio (t/A) of its thickness t to the area A of the main surface is below 0.008 in a unit of [mm/mm$^2$], a substrate having the above-mentioned warp level can be obtained. If the area of a part to be corroded and removed is below 30% of the entire main surface, such a warp level as mentioned above can be obtained even if the ratio is below 0.0008.

The thickness t of the substrate of the present invention is defined not as the thickness of a part that has undergone corrosion treatment but as the thickness of a part that has not undergone treatment, and the area A of the main surface is defined not as the area of a part that has undergone the corrosion treatment but as the area of the entire main surface.

Further, the surface roughness of a to-be-removed part of the main surface of the present invention can be set at less than 5 µm in Ra by changing the pH of a corrosive liquid and controlling the corrosion speed as mentioned above. The present invention will hereinafter be described with reference to examples. It should be noted that the present invention is not limited to the scope of the examples.

EXAMPLE 1

The preparation was made of silicon carbide powder consisting of crystal grains of 10 µm in average grain size, of above 99.9% in purity (mass base), and of the 6 H type, pure aluminum powder that has been subjected to rapid solidification by melt atomization of 50 µm in average grain size and of above 99% in purity (mass base), and aluminum alloy powder that contains Si of 5% by weight that has been subjected to rapid solidification in the same way (in the following examples, this aluminum alloy is referred to simply as aluminum alloy). The amount of cation impurities, such as Fe, in the silicon carbide powder was below 100 ppm (mass base). These powders were scaled at the composition ratio of each sample of the mass base shown in Table I, thereafter a 3% paraffin binder in the mass ratio to 100 of powder was added, and they were mixed by an ethanol wet type ball mill for three hours. Samples 1 through 8 and 12 are each a sample that uses pure aluminum as a first component, and Samples 9 through 11 are each a sample that uses aluminum alloy powder that contains Si of 5% by weight as a first component. Mixed slurry was subjected to spray drying and was granulated.

This granular powder was molded into the shape of a plate of 50 mm in length and width and of 5 mm in thickness by means of dry powdery pressing. Thereafter, this molded piece was placed in a furnace under the high frequency induction heating method, and it was first gradually heated to 400° C. in low-pressure nitrogen, and the binder was removed therefrom. Thereafter, the temperature was raised up to 665° C. in ten minutes in a nitrogen gas stream of 1 atmospheric pressure, and the molded piece was kept at this temperature for three minutes, and it was preliminarily heated. Each sample that was subjected to the preliminary heating was moved to a preheated forging die of 300° C., and was subjected to hot forging. The dimensions of each composite material sample that has been forged were about 48 mm in length and width and about 4.8 mm in thickness. Therefore, the ratio t/A of the thickness to the area of the main surface is 0.002 [mm/mm$^2$]. The relative density (i.e., the ratio of a measured density confirmed by the underwater method to a theoretical density) of each sample was 100%. The thermal conductivity and the thermal expansion coefficient were confirmed. The results are shown in Table I. The thermal conductivity was confirmed by the use of a disk-like test piece according to the laser flash method, and the thermal expansion coefficient was confirmed by the use of a pillar-like test piece according to the operating transformation method. Separately, a plate material of an aluminum alloy that contains pure aluminum and Si, which is the same in components as the raw material was used, in order to confirm each thermal conductivity in the same way. As a result, the former was 240 W/m·K, and the latter was 200 W/m·K.

sprayed onto the layer of the covering rubber so as to peel it off, and thereafter the removed part was subjected to blast finishing by means of an alumina bead of about 0.5 mm in diameter. As a result, the edge of the end of the removed part was removed. On the other hand, Sample 12 of a comparative example where the composite material of Sample 5 is ground into the same shape with a diamond tool was also produced. The depth of the removed surface of a formed body that was obtained was within 2 mm±0.05 mm in each sample. The surface roughness of the removed surface is shown in Table I by the value of Ra provided by JIS. The surface that was removed was confirmed by X-ray diffraction. As a result, SiC and Al were found.

Figure 4:
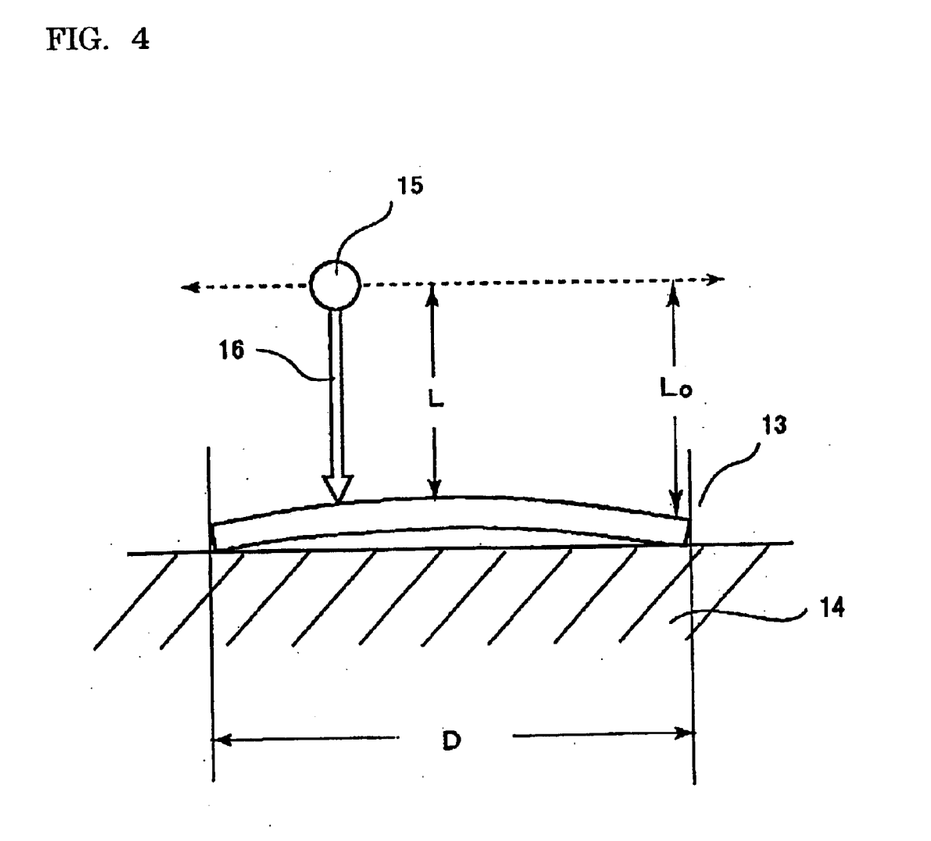
FIG. 4 explains a measuring method for a warp in the direction of the main surface of the substrate.

Thereafter, a load of 1000 cycles, in each of which the plate of each sample is maintained for 30 minutes at −60° C. for cooling and is kept for 30 minutes at 150° C. for heating, was given. Thereafter, the removed part of the surface and the warp of the smooth backside main surface were confirmed. Table I shows the results. The warp was confirmed according to a method in which, as typically shown in FIG. 4, Sample 13 is placed on a surface plate 14 with one square main surface directed upward, a laser beam 16 from a light source 15 is then scanned in the directions of two diagonals of the square main surface of the sample, and the distance from the surface of the sample is measured. In the figure, L($\mu$m) is the minimum distance in the direction of the diagonal, L$_0$($\mu$m) is the maximum distance in the direction of the diagonal, and D(mm) is the scanning distance in the direction of the diagonal. Under this condition, (L$_0$−L)/D

TABLE I

| No. | Raw Material compounding composition (% by weight) First component | Raw Material compounding composition (% by weight) Second component | Composite Material Thermal conductivity (W/m · K) | Composite Material Thermal expansion coefficient (×10$^{-6}$/° C.) | Formed Body Surface roughness Ra($\mu$m) | Formed Body Amount of warp ($\mu$m/mm) Removal surface | Formed Body Amount of warp ($\mu$m/mm) Backside main surface |
|---|---|---|---|---|---|---|---|
| 1 | 95 | 5 | 243 | 22.0 | 4.2 | 2.9 | 2.8 |
| 2 | 90 | 10 | 246 | 20.0 | 4.0 | 2.6 | 2.6 |
| 3 | 80 | 20 | 253 | 17.5 | 3.7 | 2.6 | 2.5 |
| 4 | 70 | 30 | 260 | 14.5 | 3.5 | 2.5 | 2.5 |
| 5 | 60 | 40 | 267 | 12.6 | 3.4 | 2.4 | 2.4 |
| 6 | 50 | 50 | 275 | 11.1 | 3.3 | 2.4 | 2.4 |
| 7 | 40 | 60 | 284 | 9.7 | 3.2 | 2.4 | 2.4 |
| *8 | 38 | 62 | 287 | 9.3 | SiC particles remain in corroded parts; concavity/convexity size is large. | | |
| 9 | 60 | 40 | 223 | 11.0 | 3.4 | 2.4 | 2.4 |
| 10 | 50 | 50 | 230 | 10.2 | 3.3 | 2.4 | 2.4 |
| 11 | 40 | 60 | 239 | 9.0 | 3.3 | 2.5 | 2.4 |
| *12 | 60 | 40 | 267 | 12.6 | 3.4 | 5.9 | 6.3 |

* comparative example

Figure 3:
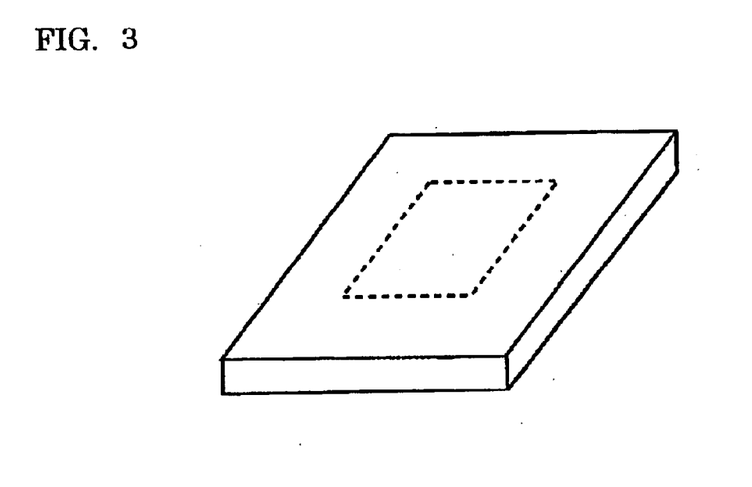
FIG. 3 explains the inside-excavation corrosion treatment of the heat-dissipating substrate of the present invention.

Thereafter, as shown by the dotted line of FIG. 3, a concave part of 30 mm in length and width and 2 mm in depth was formed at the center of the main surface of each sample by corrosion treatment. (The area ratio of the concave part to the main surface was 39%.) Natural rubber was first dissolved in toluene, and was formed into a paste. This was applied to a part that does not undergo corrosion treatment to a thickness of 0.5 mm and was dried, and, as a result, a corrosion-resistant film was formed. Each sample was soaked into a copper sulfate solution of 8% by weight in concentration until the depth of the concave part became 2 mm at room temperature. After the soak, toluene was again ($\mu$m/mm) was calculated, and a larger value in the two directions was fixed as a warp. The warp of each sample prior to the cooling/heating cycle was less than 3 $\mu$m/mm. In the samples of the present invention, the level of the warp changed minimally, before and after the cooling/heating cycle was carried out. The warp rose up to the level indicated in Table I after the cooling/heating cycle in only the sample finished by grinding.

The following are understood from the aforementioned results. (1) In the sample within the range of the amount of SiC according to the present invention, finishing treatment can be carried out without allowing the SiC particles to remain on the treated surface after the corrosion treatment is completed. (2) In the sample finished by grinding treatment, the warp in the direction of the main surface of the substrate increased by the cooling/heating cycle, however, in the sample that has undergone finishing treatment according to the present invention, a negligible increase in the warp was found before and after the cooling/heating cycle.

EXAMPLE 2

Silicon carbide powder, pure aluminum powder, and aluminum alloy powder, each of which is the same as that in Example 1, were prepared. On the other hand, a binder in which various amounts of cellulose are dissolved in hot water was prepared, and this was kneaded together with silicon carbide powder by means of a kneader. The amount of cellulose was adjusted so that the porosity of a molded piece, as described later, excluded the amount of cellulose. Thereafter, the kneaded mixture was cast into a vacuum extruder, and was molded into a sheet of 60 mm in width and 6 mm in thickness, and was excavated to be a square of 52 mm in width and length. Thereafter, these test pieces were heated to 400° C. in a nitrogen decompression atmosphere so as to remove the binder, and were kept at 1000° C. in a nitrogen gas stream for one hour, and various molded pieces with porosities shown in Table II were obtained.

On the other hand, the pure aluminum powder and the aluminum alloy powder were scaled by the amount corresponding to a pore volume of each molded piece, and were molded to have almost the same size in width and in length as the silicon carbide molded piece, and were used as an infiltrant of each molded piece sample. Each molded piece formed a thin layer of carbon (C) serving as an elution-resistant agent on all surfaces except one main surface that was brought into contact with the infiltrant when infiltrated. The molded piece was disposed on the corresponding infiltrant, and was kept in a nitrogen gas stream for one hour at 665° C., and each infiltrant was infiltrated in the pore of the molded piece. In the shape after the infiltration, the width and length were 50 mm, and the thickness was 5 mm. In Samples 13 through 17 and 21, the pure aluminum was infiltrated, and, in Samples 18 through 20, the aluminum alloy was infiltrated. In the infiltrated body, blast finishing by the alumina bead was applied onto the surface where the infiltrant remained, and eluted-residues were removed. The relative density of the obtained infiltrated body was 100%. Those thermal conductivities and thermal expansion coefficients were confirmed as in Example 1. The results are shown in Table II.

Figure 5:
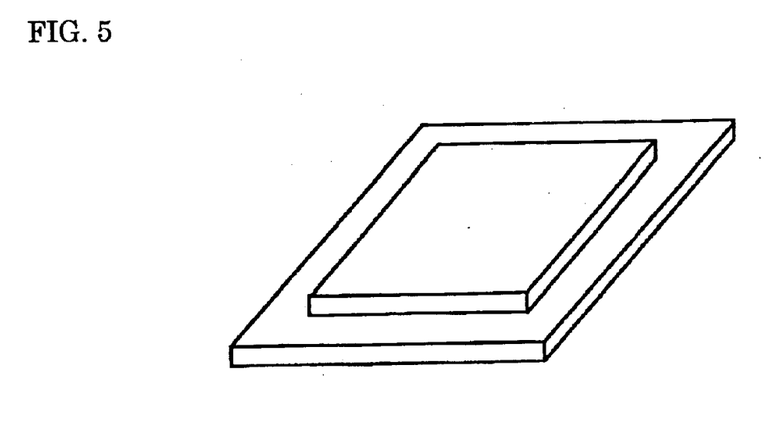
FIG. 5 explains the corrosion treatment of the heat-dissipating substrate of the present invention.

Thereafter, as shown in FIG. 5, an upper row surface of 40 mm both in length and in width was left at the center, and a collar part of 3 mm in the entire thickness was formed by corrosion treatment outside it. (The area ratio of the collar part to the main surface was 36%). First, a corrosion-resistant film of 0.5 mm in thickness with the same rubber as that of Example 1 was bonded with an adhesive onto the upper row surface of the front main surface that is not subjected to corrosion treatment, onto the lower part of 2 mm of all side surfaces, and onto the entire backside of the main surface. As a result, a corrosion-resistant film was formed. These samples were first soaked in a copper sulfate solution of 10% by weight in concentration at room temperature. After the soak, the adhesive layer of the rubber layer was peeled off, as in Example 1. The removed part was subjected to blast finishing by an alumina bead of about 0.5 mm in diameter. As a result, the edge of the end of the removed part was removed. On the other hand, Sample 21 of a comparative example where the composite material of Sample 14 is ground into the same collar shape with a diamond tool in the same way as the above was also produced. The thickness of the collar part of a formed body that had been obtained was within 3±0.05 mm in each sample. The surface roughness of the removal surface is shown in Table I by the value of Ra provided by JIS. The surface that was removed was confirmed by X-ray diffraction. As a result, SiC and Al were found.

TABLE II

| | | Composite material | | | | Formed Body | | |
| | | Composition (% by weight) | | Thermal | Thermal | | Amount of warp ($\mu$ m/mm) | |
| No. | Molded piece Porosity (%) | First component | Second component | conductivity (W/m · K) | expansion coefficient ($\times 10^{-6}$/° C.) | Surface roughness Ra($\mu$ m) | Removal surface | Backside main surface |
|---|---|---|---|---|---|---|---|---|
| *13 | 66 | 62 | 38 | Impossible to produce it because the shape of the molded piece was deformed | | | | |
| 14 | 64 | 60 | 40 | 275 | 11.8 | 3.3 | 2.6 | 2.6 |
| 15 | 54 | 50 | 50 | 282 | 10.8 | 3.2 | 2.5 | 2.6 |
| 16 | 44 | 40 | 60 | 290 | 8.9 | 3.2 | 2.5 | 2.6 |
| *17 | 53 | 37 | 63 | 293 | 8.7 | SiC particles remain in corroded parts; concavity/convexity size is large. | | |
| 18 | 63 | 60 | 40 | 230 | 11.0 | 3.3 | 2.4 | 2.5 |
| 19 | 53 | 50 | 50 | 290 | 9.9 | 3.2 | 2.5 | 2.6 |
| 20 | 45 | 40 | 60 | 240 | 8.9 | 3.2 | 2.5 | 2.6 |
| *21 | 64 | 60 | 40 | 230 | 11.8 | 3.3 | 6.1 | 6.4 |

* comparative example

Thereafter, a load of 1000 cycles, in each of which the plate of each sample is maintained for 30 minutes at −60° C. for cooling and is kept for 30 minutes at 150° C. for heating, was given to the plate of each sample. Thereafter, the removed part of the surface and the warp of the smooth backside main surface were confirmed. Table II shows the results. The warp of each sample prior to the cooling/heating cycle was less than 3 $\mu$m/mm. In the samples of the present invention, the level of the warp changed minimally before and after the cooling/heating cycle was carried out. The warp rose up to the level shown in Table II after the cooling/heating cycle in only the sample finished by grinding.

The following are understood from the aforementioned results. (1) In the sample within the range of the amount of SiC according to the present invention, finishing treatment can be carried out without allowing the SiC particles to remain on the treated surface after the corrosion treatment is completed. (2) In the sample finished by grinding treatment, the warp in the direction of the main surface of the substrate increased by the cooling/heating cycle, but, in the sample that has undergone finishing treatment according to the present invention, a minimal increase in the warp was found before and after the cooling/heating cycle.

EXAMPLE 3

Silicon carbide powder, pure aluminum powder, and aluminum alloy powder, each of which is the same as that in Example 1, were prepared. The pure aluminum powder and the aluminum alloy powder were cast into a prepared graphite die cavity of 50 mm both in width and in length and 5 mm in depth, and were heated and melted in nitrogen at 700° C. Thereafter, the silicon carbide powder was cast into the molten metal, and was stirred for 30 minutes, and the silicon carbide powder particles were dispersed into the hot metal almost uniformly. Thereafter, they were cooled to room temperature. The molten metal of each composition ratio shown in Table III was solidified according to this method, and composite materials were produced. The solidified body removed the melted residue of the first component at the outer periphery by carrying out blast finishing with an alumina bead. The dimension of the composite material was 50 mm in length and in width and 5 mm in thickness, and the relative densities were completely 100%. Those thermal conductivities and thermal expansion coefficients were confirmed in the same way as in Example 1. Table III shows the results. In Samples 22 through 29 and 33 in the table, the first component indicates the pure aluminum, and, in Samples 30 through 32, the first component indicates the aluminum alloy.

Thereafter, a formed body with the same inside-excavation shape of 30 mm both in length and in width was produced in the same way as in Example 1. (The area ratio of the concave part to the main surface was 36%.) Sample 33 was formed into the inside-excavation shape by applying grinding-treatment onto the composite material of Sample 26 in the same way as Sample 12 of Example 1. The depth of the removal surface of the formed body that has been obtained was within 2 mm±0.05 mm in each sample. The surface roughness of the removed surface is shown in Table I by the value of Ra provided by JIS. The surface that was removed was confirmed by X-ray diffraction. As a result, SiC and Al were found.

Thereafter, a load of 1000 cycles, in each of which the plate of each sample is maintained for 30 minutes at −60° C. for cooling and is kept for 30 minutes at 150° C. for heating, was given to the plate of each sample. Thereafter, the removed part of the surface and the warp of the smooth backside main surface were confirmed. Table III shows the results. The warp of each sample prior to the cooling/heating cycle was less than 3 μm/mm. In the samples of the present invention, the level of the warp changed minimnally before and after the cooling/heating cycle was carried out. The warp rose to the level shown in Table III in only the sample finished by grinding after the cooling/heating cycle.

TABLE III

| | Composite material | | | | Formed body | | |
| | Composition (% by weight) | | | Thermal | Surface | Amount of warp (μ m/mm) | |
| No. | First component | Second component | Thermal conductivity (W/m · K) | expansion coefficient (×10⁻⁶/° C.) | roughness Ra(μ m) | Removal surface | Backside main surface |
|---|---|---|---|---|---|---|---|
| 22 | 95 | 5 | 231 | 22.3 | 4.7 | 2.9 | 2.7 |
| 23 | 90 | 10 | 235 | 20.2 | 4.1 | 2.8 | 2.7 |
| 24 | 80 | 20 | 241 | 17.8 | 3.8 | 2.7 | 2.6 |
| 25 | 70 | 30 | 252 | 14.9 | 3.7 | 2.6 | 2.6 |
| 26 | 60 | 40 | 259 | 12.9 | 3.7 | 2.6 | 2.6 |
| 27 | 50 | 50 | 265 | 11.4 | 3.6 | 2.5 | 2.6 |
| 28 | 40 | 60 | 277 | 9.3 | 3.4 | 2.5 | 2.5 |
| *29 | 38 | 62 | 280 | 9.0 | SiC particles remain in corroded parts; concavity/convexity size is large. | | |
| 30 | 60 | 40 | 217 | 11.4 | 3.5 | 2.5 | 2.5 |
| 31 | 50 | 50 | 224 | 10.7 | 3.5 | 2.5 | 2.5 |
| 32 | 40 | 60 | 230 | 9.0 | 3.4 | 2.5 | 2.5 |
| *33 | 60 | 40 | 259 | 12.9 | 3.7 | 5.6 | 5.8 |

* comparative example

The following are understood from the aforementioned results. (1) In the sample within the range of the amount of SiC according to the present invention, finishing treatment can be carried out without allowing the SiC particles to remain on the treated surface after the corrosion treatment is completed. (2) In the sample finished by grinding treatment, the warp in the direction of the main surface of the substrate increased by the cooling/heating cycle but, in the present invention, a change in the warp was hardly found before and after the cooling/heating cycle.

EXAMPLE 4

Two kinds of packages different in structure were manufactured. The two kinds of packages are made of the same materials as those of Samples 5, 9, 14, and 26 among the samples of the above-mentioned examples and which employ the composite material of the present invention shown in FIG. 6.

Figure 6:
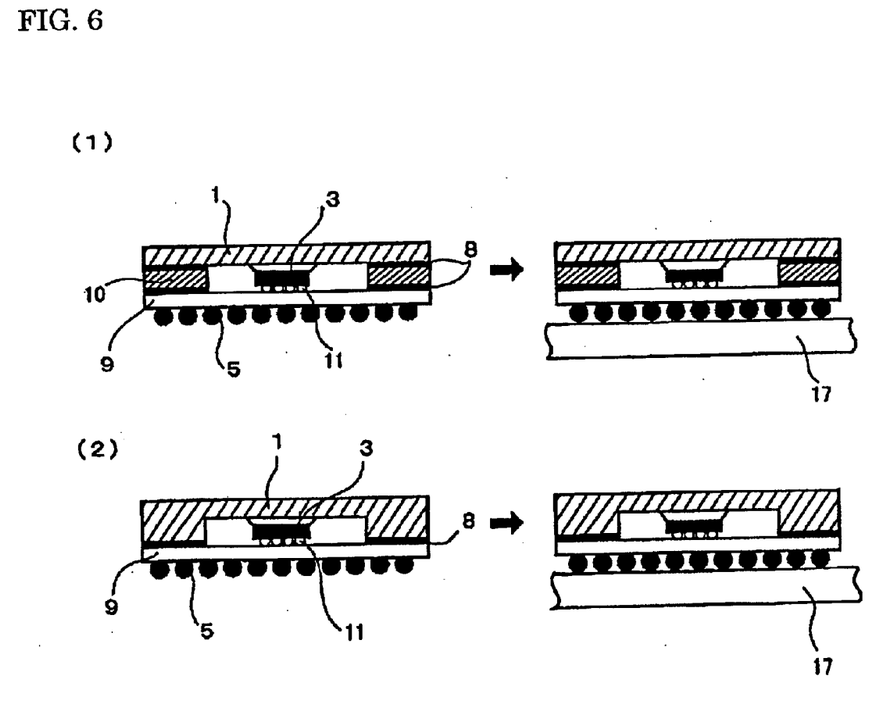
FIG. 6 typically explains packages of embodiments of the present invention and situations in which they are mounted on a motherboard.

(1) of FIG. 6 shows a package of a first structure. Reference numeral 1 designates a simple planar heat-dissipating substrate that is made of the same material as that of each sample and that is 40 mm in length and width and 3 mm in thickness. Reference numeral 10 designates a stiffener that is 40 mm in outer length and outer width and 3 mm in thickness and that is made of electrolytic copper subjected to frame-like plastic processing (thermal expansion coefficient: $16.3 \times 10^{-6}/°$ C.). Reference numeral 9 designates a plastic substrate that is 40 mm both in outer length and in outer width (thermal expansion coefficient: $12.6 \times 10^{-6}/°$ C.). As shown in the figure, a Si semiconductor element 3 was joined to the heat-dissipating substrate by die bonding, and was mounted onto the plastic substrate according to a method using a flip chip 11. The stiffener 10 and the upper and lower substrates were joined together with an adhesive 8, and, likewise, the plastic substrate 9 and a ball grid 5 made of solder were joined together with the adhesive 8. (2) of FIG. 6 is a package of a second structure. The external dimensions thereof are the same as those of the fist-structure package, and the stiffener part is integrated by a composition corresponding to the above-mentioned sample of the present invention. The difference is that the lid-shaped substrate 1 in which a cavity part has been excavated by the corrosion treatment of the present invention is used. The packaging of the Si semiconductor element is carried out in the same way as that of the first structure. The joining between the plastic substrate 9 and the frame of the heat-dissipating substrate 1 and between the ball grid 5 and the plastic substrate was carried out with the same adhesive as mentioned above. Further, a package was manufactured that has the second structure and in which a cavity part has been excavated by grinding treatment of the composition/dimension corresponding to each sample mentioned above. For each sample mentioned above, 100 package samples were manufactured. Each sample package includes each sample mentioned above.

Each of the package samples was heated for 20 minutes at 230° C., and was mounted on a plastic motherboard 17 (thermal expansion coefficient: $13.0 \times 10^{-6}/°$ C.) by the solder ball grid 5, as shown on the right of FIG. 6. This assembly was manufactured by the number (i.e., 100 pieces) of respective packages, and the state of deformation of the assembly caused when packaged was confirmed.

As a result, in the case of the first structure, since the heat-dissipating substrate in which the Al—SiC composite material and the stiffener of electrolytic copper are combined together in the conventional way was used, the entire substrate was deformed when packaged because of a difference in the thermal expansion coefficient therebetween, and damage occurred in the adhesive interface on the side of the composite material. Further, a warp resulting from the deformation also occurred in the plastic substrate, and there occurred a disadvantage in that the substrate and the motherboard could not be satisfactorily joined together by the ball grid. When any one of the many kinds of composite materials was used, defects appeared in the ratio of 40–50 pieces to 100 pieces. In the case of the second structure, lid made of the Al—SiC composite material of the present invention which has undergone the inside-excavation by corrosion treatment, whose thermal expansion coefficient is very close to that of the plastic substrate, and which has small residual distortion resulting from a small difference in the thermal expansion coefficient therebetween after the inside-excavation is carried out, was used. Therefore, damage at the interface between the lid and plastic substrate and defects resulting from the deformation of the two substrates were hardly observed when any kind of composite material was used. However, in the second structure, use was also made of the lid made of the Al—SiC composite material of the comparative example which is the same in material and which has undergone the inside-excavation by grinding treatment despite its thermal expansion coefficient being very close to that of the plastic substrate. As a result, damage at the interface between this and the plastic substrate and defects resulting from the deformation of the lid/substrate were caused. In this case, this kind of defect appeared in the ratio of 20–30 pieces to 100 pieces when any kind of composite material was used.

The load of 1000 cycles, in each of which the plate of each sample is maintained for 30 minutes at −60° C. for cooling and is kept for 30 minutes at 150° C. for heating, was given to a group of 20 pieces to ones in which no defect was observed when packaged among the above-mentioned assemblies. As a result, in the assemblies, which used the substrate of the comparative example excavated by grinding treatment, among the assemblies of the first structure and the assemblies of the second structure, peeling-off was caused especially at the connection part between the plastic substrate and the stiffener and at the connection part between the motherboard and the ball grid after the cooling/heating cycle. On the other hand, in the assemblies of the second structure where the substrate manufactured according to the method of the present invention was mounted, no defect was observed.

A group of 10 assemblies of assemblies that were mounted with the above-mentioned structure and in which no defect was observed among the above-mentioned assemblies were attached to a semiconductor device, and they were continuously operated by the working output of 50 W for 1000 hours. As a result, in the device to which the second-structure package that used the composite material of the present invention was attached, a decrease in output was minimally observed. In contrast, in the device to which the first-structure package and the second-structure package that used the composite material of the comparative example were attached, some of them demonstrated lowered output or some stopped working after a lapse of 300 to 500 hours.

If a heat-dissipating substrate within the range of the composition of the present invention other than the above-mentioned samples is used, it will be understood that the heat-dissipating substrate can be combined with packaging members that are within a wide range corresponding to the substrate because the range of its thermal expansion coefficient is wide. For example, it is understood that the substrate can be satisfactorily used in combination with metal such as aluminum or copper when the materials of Samples 1 through 3 of Table I are used, and the substrate can be satisfactorily used in combination with ceramics, or the like, whose thermal expansion coefficient is relatively high when the materials such as Sample 11 of Table I are used.

INDUSTRIAL APPLICABILTY

As detailedly described above, the substrate made of an Al—SiC composite material of the present invention to which finishing treatment, such as joggling or inside-excavation, has been applied not by machining but by corrosion treatment is cheaper in processing than machining. Since distortion or residual stress caused by processing when treated is minimal, defects do not appear, such as a warp, deformation, and damage, and are caused especially when it is mounted to a semiconductor package which includes a plastic substrate or that are caused by a cooling/heating load when it is actually working after it is mounted on a motherboard and is built in a semiconductor device. Therefore, it is possible to provide a semiconductor substrate that is light in weight, that is low cost compared to any conventional substrate, and that is high in reliability, to provide a semiconductor package that uses the substrate, and to provide a semiconductor device that uses the substrate.

What is claimed is:

1. An aluminum-silicon carbide semiconductor substrate whose first component is metal chiefly composed of aluminum and whose second component is silicon carbide, wherein the second component is compositionally 5 to 60% by weight of the whole and the remainder is the first component, and a warp in a direction of a main surface thereof is 3 µm/mm or less.

2. The aluminum-silicon carbide semiconductor substrate of claim 1, wherein a ratio (t/A) of a thickness (t) of the main surface to an area (A) thereof is 0.008 or less in a unit of [mm/mm$^2$].

3. The aluminum-silicon carbide semiconductor substrate of claim 1, wherein a surface roughness of the main surface is 5 µm or less in Ra.

4. A package for a semiconductor element that uses the semiconductor substrate as recited in claim 1.

5. A semiconductor device that uses the semiconductor substrate as recited in claim 1.

6. The aluminum-silicon carbide semiconductor substrate of claim 2, wherein a surface roughness of the main surface is 6 µm or less in Ra.

7. A package for a semiconductor element that uses the semiconductor substrate as recited in claim 2.

8. A package for a semiconductor element that uses the semiconductor substrate as recited in claim 3.

9. A package for a semiconductor element that uses the semiconductor substrate as recited in claim 6.

10. A semiconductor device that uses the semiconductor substrate as recited in claim 2.

11. A semiconductor device that uses the semiconductor substrate as recited in claim 3.

12. A semiconductor device that uses the semiconductor substrate as recited in claim 6.

* * * * *